(12) United States Patent
Dakshina-Murthy et al.

(10) Patent No.: US 6,864,164 B1
(45) Date of Patent: Mar. 8, 2005

(54) FINFET GATE FORMATION USING REVERSE TRIM OF DUMMY GATE

(75) Inventors: Srikanteswara Dakshina-Murthy, Austin, TX (US); Zoran Krivokapic, Santa Clara, CA (US); Cyrus E. Tabery, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 286 days.

(21) Appl. No.: 10/320,536

(22) Filed: Dec. 17, 2002

(51) Int. Cl.⁷ .......................................... H01L 21/3205
(52) U.S. Cl. ..................... 438/585; 438/283; 438/589
(58) Field of Search ................ 438/151, 157, 438/176, 197, 283, 585, 589

(56) References Cited

U.S. PATENT DOCUMENTS

| | | |
|---|---|---|
| 5,801,397 A | 9/1998 | Cunningham ................. 257/66 |
| 5,960,270 A | 9/1999 | Misra et al. ................. 438/197 |
| 6,265,256 B1 | 7/2001 | An et al. ..................... 438/201 |
| 6,303,447 B1 | 10/2001 | Chhagan et al. ............. 438/299 |
| 6,342,410 B1 | 1/2002 | Yu ............................. 438/164 |
| 6,396,108 B1 | 5/2002 | Krivokapic et al. ......... 257/365 |
| 6,406,951 B1 | 6/2002 | Yu ............................. 438/183 |
| 6,413,802 B1 | 7/2002 | Hu et al. .................... 438/151 |
| 6,458,662 B1 | 10/2002 | Yu ............................. 438/286 |
| 6,475,890 B1 | 11/2002 | Yu ............................. 438/574 |
| 6,515,320 B1 | 2/2003 | Azuma et al. ............... 257/288 |
| 6,525,403 B2 | 2/2003 | Inaba et al. ................. 257/618 |
| 6,551,885 B1 | 4/2003 | Yu ............................. 438/300 |
| 6,551,886 B1 | 4/2003 | Yu ............................. 438/300 |
| 6,562,665 B1 | 5/2003 | Yu ............................. 438/149 |
| 6,583,469 B1 | 6/2003 | Fried et al. ................. 257/329 |
| 6,645,797 B1 * | 11/2003 | Buynoski et al. ........... 438/157 |
| 2002/0153587 A1 | 10/2002 | Adkisson et al. | 
| 2003/0111686 A1 | 6/2003 | Nowak |
| 2003/0113970 A1 | 6/2003 | Fried et al. |
| 2003/0141525 A1 | 7/2003 | Nowak |
| 2003/0151077 A1 | 8/2003 | Mathew et al. |

FOREIGN PATENT DOCUMENTS

WO   WO 03/015182 A2   2/2003

OTHER PUBLICATIONS

Digh Hisamoto et al., "FinFET—A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

Co–pending U.S. Appl. No. 10/310,777 entitled "Damascene Gate Process with Sacrificial Oxide in Semiconductor Devices," filed Dec. 6, 2002, 19 page specification, 10 sheets of drawings.

(List continued on next page.)

*Primary Examiner*—Jack Chen
(74) *Attorney, Agent, or Firm*—Harrity & Snyder, LLP (57) ABSTRACT

A method of forming a gate electrode for a fin field effect transistor (FinFET) includes forming a fin on a substrate and forming an oxide layer over the fin. The method further includes forming a carbon layer over the oxide layer and forming a trench in the oxide layer and the carbon layer, where the trench crosses over the fin. The method also includes filling the trench with a material to form the gate electrode.

17 Claims, 11 Drawing Sheets

OTHER PUBLICATIONS

Copy of co-pending Appl. No. 10/459,589; entitled "Fin-FET Gate Formation Using Reverse Trim and Oxide Polish"; filed on Jun. 12, 2003; 45 pages.

Copy of co-pending Appl. No. 10/645,577; entitled Sacrificial Oxide Protection During Dummy Gate Removal in Damascene Gate Process in Semiconductor Devices; filed on Aug. 22, 2003; 28 pages.

Copy of co-pending Appl. No. 10/720,166, entitled "Damascene Gate Process with Sacrificial Oxide in Semiconductor Devices" and Preliminary Amendment filed in 10/720,166 on Nov. 25, 2003; 41 pages.

Copy of U.S. Appl. No. 10/754,559; filed Jan. 12, 2004; entitled: "Damascene Tri-Gate Finfet"; 28 pages.

Stephen H. Tang et al., "Comparison of Short-Channel Effect and Offstate Leakage in Symmetric vs. Asymmetric Double Gate MOSFETs", IEEE International SOI Conference, Oct. 2000, pp. 120–121.

* cited by examiner

FINFET GATE FORMATION USING REVERSE TRIM OF DUMMY GATE

TECHNICAL FIELD

The present invention relates generally to transistors and, more particularly, to fin field effect transistors (FinFETs).

BACKGROUND ART

Scaling of device dimensions has been a primary factor driving improvements in integrated circuit performance and reduction in integrated circuit cost. Due to limitations associated with existing gate-oxide thicknesses and source/drain (S/D) junction depths, scaling of existing bulk MOSFET devices below the 0.1 $\mu$m process generation may be difficult, if not impossible. New device structures and new materials, thus, are likely to be needed to improve FET performance.

Double-gate MOSFETs represent new devices that are candidates for succeeding existing planar MOSFETs. In double-gate MOSFETs, the use of two gates to control the channel significantly suppresses short-channel effects. A FinFET is one example of a recent double-gate structure that includes a channel formed in a vertical fin. The FinFET is similar to existing planar MOSFET in layout and fabrication. The FinFET also provides a range of channel lengths, CMOS compatibility and large packing density compared to other double-gate structures.

Existing FinFET structures have relatively severe topographies. The severe topography associated with the FinFET structure has conventionally limited the ability to print and pattern small features for the FinFET gate. Therefore, there exists a need for methods for forming a gate of a FinFET that permits a wide photo margin, thus, increasing the ability to print and pattern the small features of the FinFET gate.

DISCLOSURE OF THE INVENTION

Consistent with the present invention, a method of forming a gate of a FinFET transistor is provided that permits a wide photo margin. Consistent with the invention, a reverse trim process may be employed for forming a gate within a layer of material, such as, for example, an oxide layer. The gate may be formed within the oxide layer by forming a carbon layer on the oxide layer and a layer of anti-reflective coating on the carbon layer. A photo-resist material may then be applied in a pattern, corresponding to a shape of the gate, to the anti-reflective coating. A portion of the carbon layer may then be etched away to leave a portion of the carbon layer in the shape of the pattern of the photo-resist material. A nitride layer may then be applied to the exposed surface of the oxide layer. The remaining portion of the carbon layer may be removed to expose a portion of the oxide layer in the shape of the pattern of the photo-resist material. The exposed oxide may be etched, selective to nitride and the material of the fin, to create a trench that is approximately transverse to the underlying fin. The gate electrode may be then formed within the created trench. Formation of the gate electrode, consistent with the invention, permits a wide photo margin, thus, increasing the ability to print and pattern the small features of the FinFET gate.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a gate electrode for a FinFET. The method includes forming a fin on a substrate and forming an oxide layer over the fin. The method further includes forming a carbon layer over the oxide layer and forming a trench in the oxide layer and the carbon layer, the trench crossing over the fin. The method also includes filling the trench with a material to form the gate electrode.

According to a further aspect of the invention, a method of forming a gate electrode for a FinFET is provided. The method includes forming an oxide layer over a fin and forming a carbon layer over the oxide layer. The method further includes applying a layer of photo-resist material in a pattern corresponding to a shape of the gate electrode and etching, using the layer of photo-resist material, the carbon layer to produce a portion of the carbon layer formed in the pattern of the photo-resist material. The method also includes forming a nitride layer adjacent to the portion of the carbon layer and removing the portion of the carbon layer to expose a portion of the oxide layer. The method additionally includes etching the exposed portion of the oxide layer to form a trench in the oxide layer and filling the trench with a material to form the gate electrode.

Other advantages and features of the present invention will become readily apparent to those skilled in this art from the following detailed description of implementations consistent with the principles of the invention. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, a reverse trim process for creating FinFET gates is provided that increases the ability to print and pattern small features of the FinFET gate. The reverse trim process enables formation of trimmed damascene gates that allow wide photo margins.

Figure 1A:
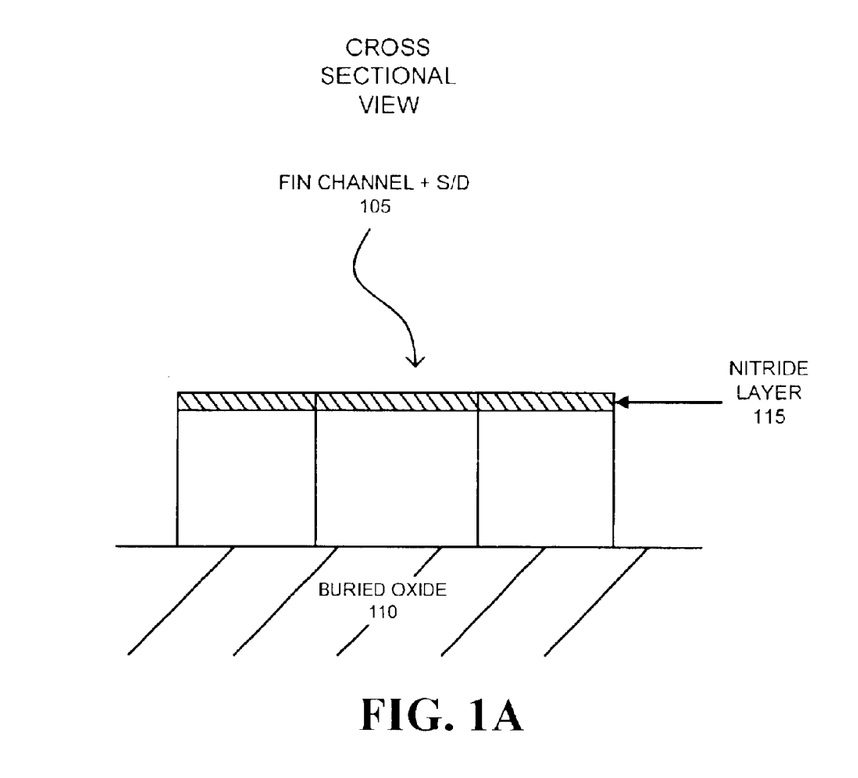
FIGS. 1A and 1B illustrate an exemplary starting substrate and fin for creating a FinFET consistent with the present invention.
Figure 1B:
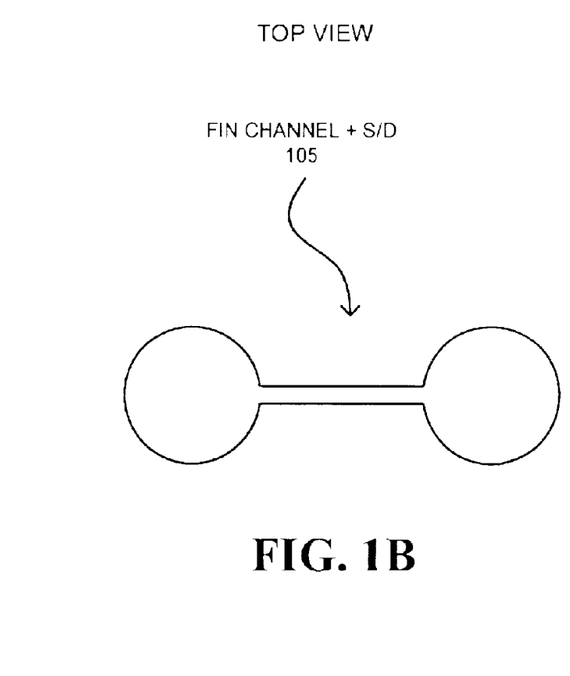

FIGS. 1A and 1B illustrate a FinFET fin channel and source/drain (S/D) 105 formed on a buried oxide layer 110 in accordance with an exemplary embodiment of the present invention. Fin channel and S/D 105 may be formed on buried oxide layer 110 using any conventional technique. Alternatively, fin channel and S/D 105 may be formed using the exemplary process described in co-pending application Ser. No. 10/633,499, entitled "Epitaxially Grown Fin for FinFET" and filed Aug. 5, 2003. Fin channel and S/D 105 may include, for example, silicon (Si). Other materials, such as germanium (Ge), may alternatively be used. A layer of material, such as, for example, a nitride layer 115 may be formed upon fin channel and S/D 105, as illustrated in FIG. 1A. The thickness of layer 115 may range, for example, from about 200 Å to about 600 Å.

Figure 2A:
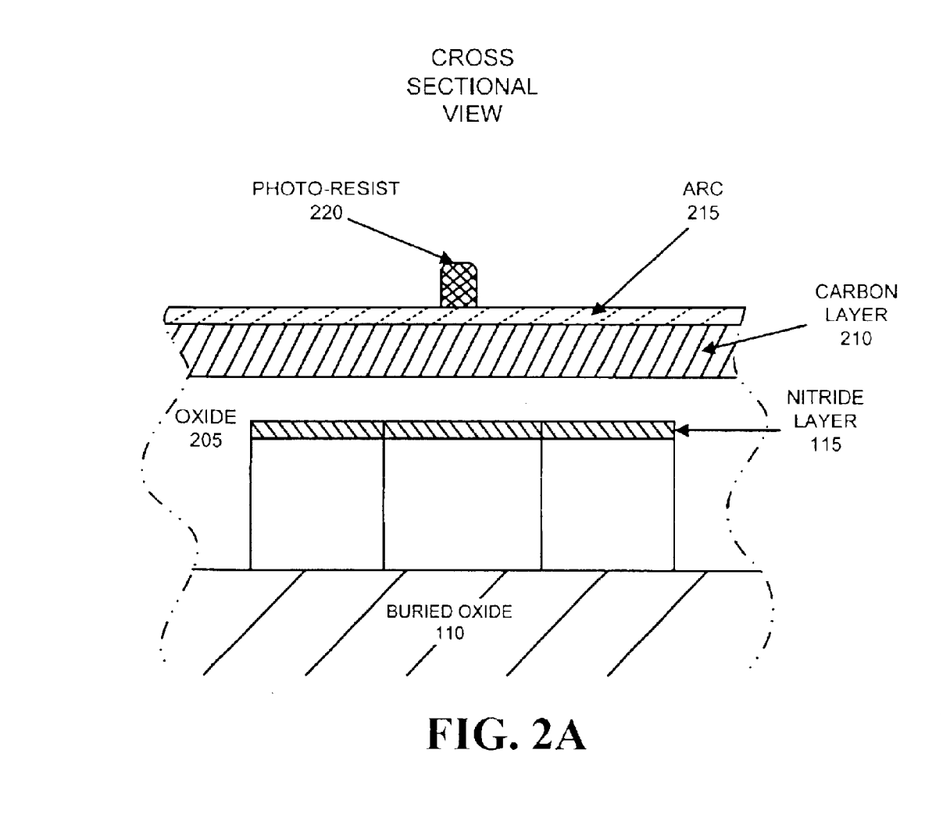
FIGS. 2A and 2B illustrate exemplary oxide and carbon layers, and an anti-reflective coating (ARC) formed over a fin consistent with the invention.
Figure 2B:
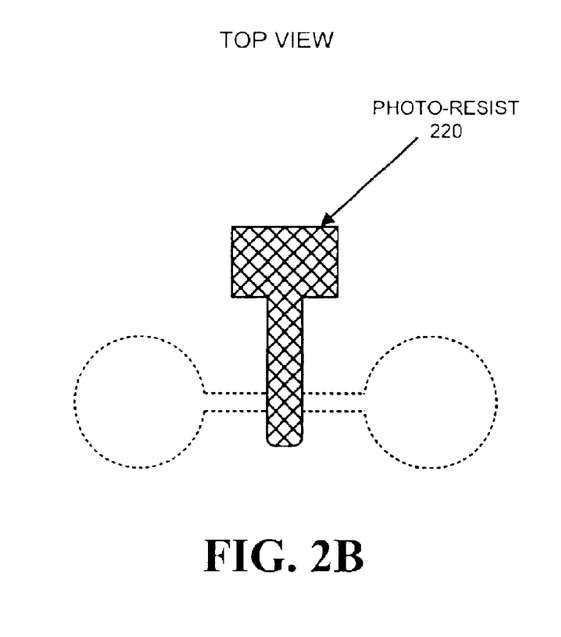

As shown in FIGS. 2A and 2B, an oxide layer 205 may be formed over fin channel and S/D 105. Oxide layer 205 may be formed, for example, using existing deposition processes followed by existing planarization processes to produce a planar oxide surface. Oxide layer 205 may include any type of oxide material, such as, for example, silicon oxide. The thickness of oxide layer 205 may range, for example, from about 1500 Å to about 3000 Å. The thickness of oxide layer 205 may, though, be dependent on the height of the already existing fin channel and S/D 105. For example, for a typical fin channel and S/D 105 height of 1000 Å, a desired final planarized thickness of oxide layer 205 may be about 1500 Å. To result in a planarized thickness of 1500 Å, however, approximately 2500 Å of oxide layer 205 may first be deposited, with 1000 Å being lost in the planarization process.

After forming oxide layer 205, a layer of material, such as, for example, a carbon layer 210 may be formed on oxide layer 205. The thickness of carbon layer 210 may range, for example, from about 600 Å to about 1000 Å. An anti-reflective coating (ARC) 215 may then be applied to carbon layer 210. ARC 215 may be applied, for example, using existing spin-on or Chemical Vapor Deposition (CVD) techniques. A photo-resist layer 220, patterned in the shape of a desired FinFET gate, may be formed on ARC 215. Photo-resist layer 220 may include any type of existing photo-resist material employed in conventional photolithography. Critical dimensions of photo-resist layer 220 may be reduced using a resist trim etch process, such as, for example, an $O_2/N_2$, $O_2/HBr$, $O_2/Cl_2$ chemistry plasma etching process. This resist trim etching process enables the formation of small lines to form small spaces in carbon layer 210.

Figure 3:
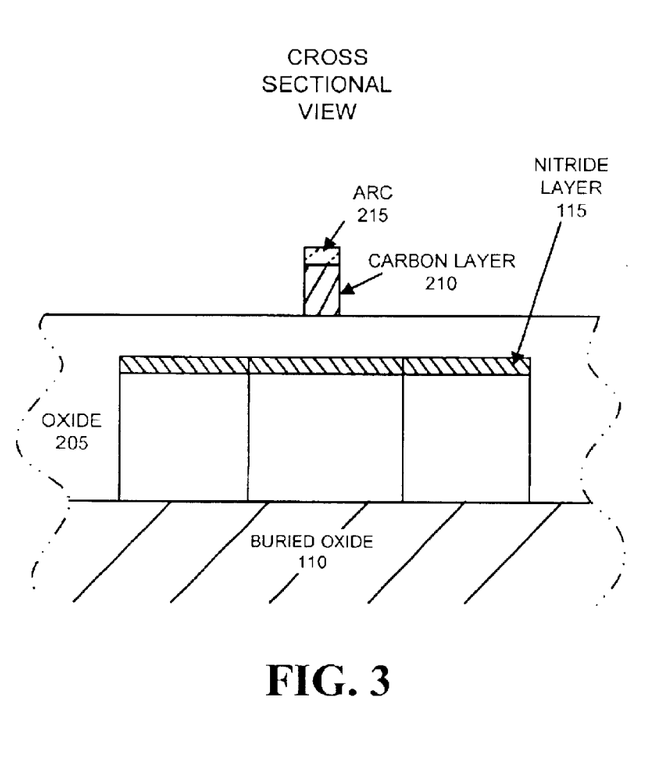
FIG. 3 illustrates a cross sectional view of the removal of a portion of the carbon layer of FIG. 2A consistent with the invention.
Figure 4:
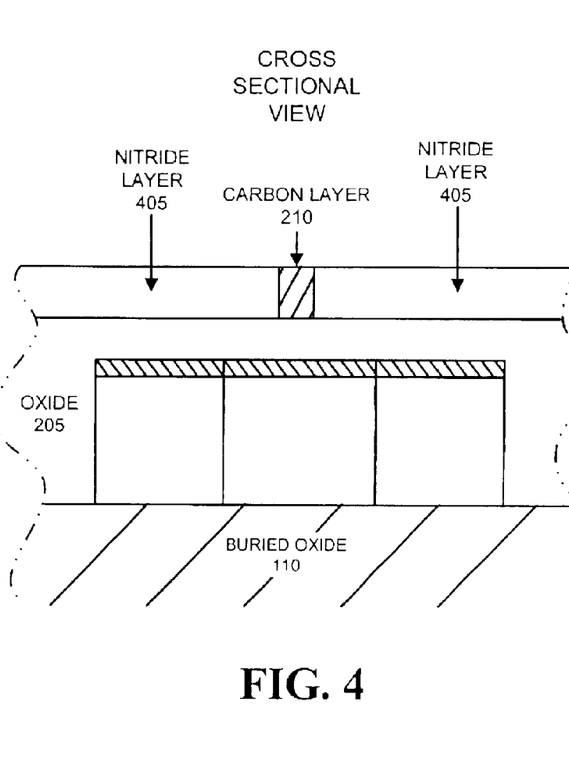
FIG. 4 illustrates a cross sectional view of an exemplary nitride layer formed on the oxide layer of FIG. 3 consistent with the invention.

After formation of oxide layer 205, carbon layer 210, ARC 215, and photo-resist 220, carbon layer 210 may be etched away to form a small portion of carbon layer 210 beneath photo-resist 220, as shown in FIG. 3. Conventional etching techniques, such as, for example, plasma etching techniques using $O_2/N_2$, $O_2/HBr$, $O_2/Cl_2$ chemistries, may be employed to etch ARC 215 and carbon layer 210, including ashing of photoresist layer 220. As shown in FIG. 4, a layer of material, such as, for example, a nitride layer 405 may then be formed on oxide layer 205. Nitride layer 405 may be formed using, for example, existing deposition techniques. The thickness of nitride layer 405 may range, for example, from about 800 Å to about 1500 Å.

Figure 5:
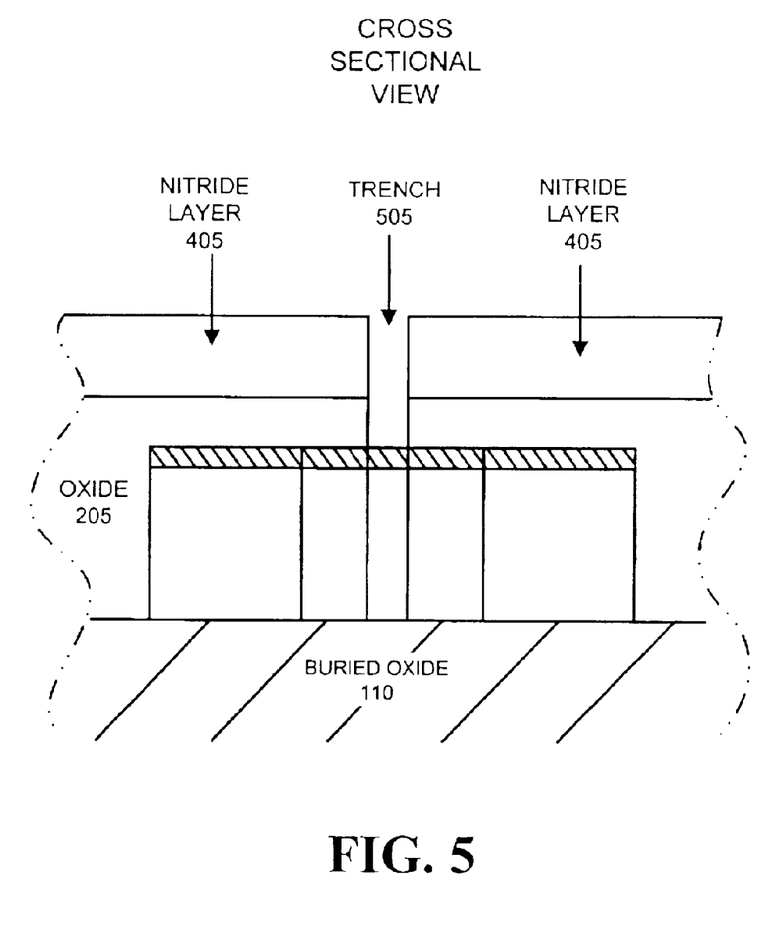
FIG. 5 illustrates an exemplary trench etched in the oxide layer of FIG. 4 consistent with the invention.

The carbon in the remaining portion of carbon layer 210 may be removed down to oxide layer 205, as shown in FIG. 5. A portion of oxide layer 205, exposed by removal of carbon layer 210, may be removed to create a trench 505 extending down to buried oxide layer 110, as shown in FIG. 5. The oxide may be removed using, for example, an existing oxide etching process that is selective to nitride (i.e., nitride layer 405) and silicon (i.e., fin channel and S/D 105). The oxide etching process may, for example, include a $CHF_3$ rich or $C_4F_8/CO/Ar$ etching process, or the like.

Figure 6A:
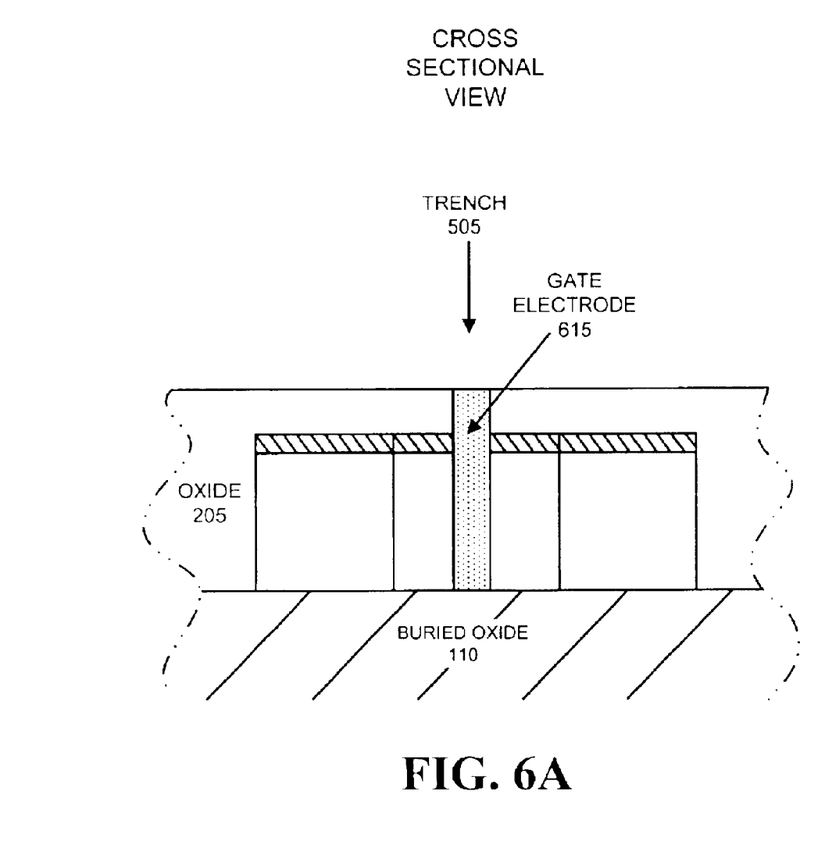
FIGS. 6A, 6B and 6C illustrate the formation of a dielectric and gate electrode in the trench of FIG. 5 consistent with the invention.
Figure 6B:
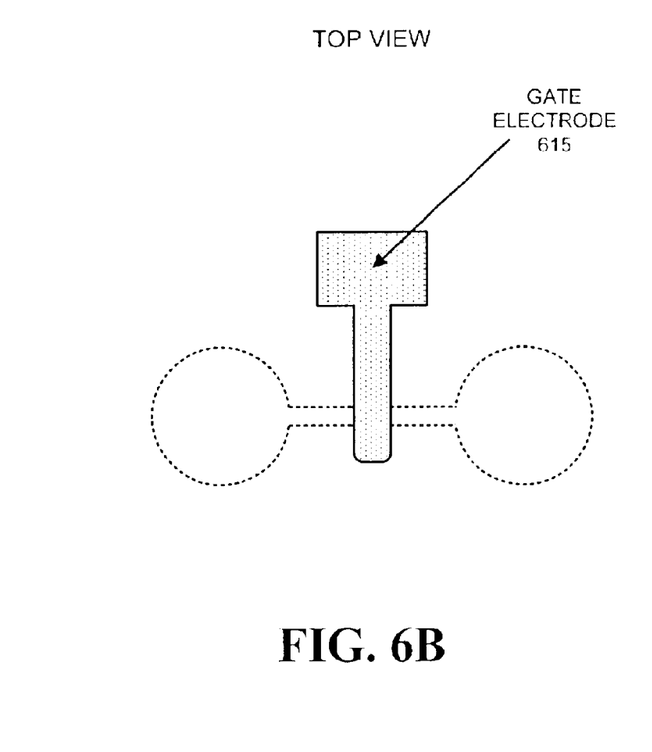
Figure 6C:
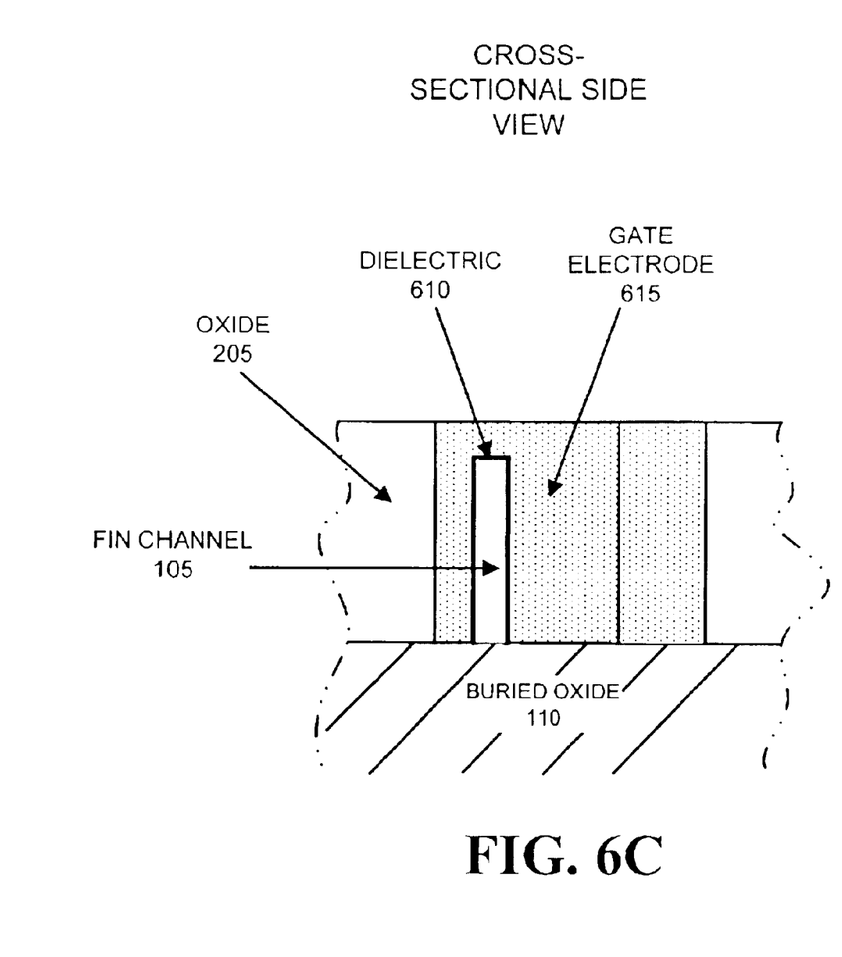

As shown in FIGS. 6A, 6B and 6C, nitride layer 405 may be stripped away from oxide layer 205. A dielectric material 610, such as, for example, an oxide material, may then be formed on the sidewalls of fin channel 105 exposed within trench 505. Dielectric 610 may be formed on the sidewalls of fin channel 105 using existing growth or deposition processes. The thickness of dielectric 610 may range, for example, from about 10 Å to about 50 Å. Gate electrode 615 may then be formed in trench 505 using, for example, existing deposition processes. Gate electrode 615 may include materials such as, for example, polysilicon, a metal, or a combination. Subsequent to formation of gate electrode 615, the upper exposed surface of gate electrode 615 may be polished to complete the formation of the gate electrode 615 upon the FinFET fin channel.

As described above, a reverse trim process for creating FinFET gates is provided that enables formation of trimmed damascene gates. The trimmed damascene gates, consistent with the invention, allow wide photo margins and, thus, improve the ability to print and pattern small features of the FinFET gate.

EXEMPLARY LATERAL EPITAXIAL GROWH OF NARROW FIN CHANNEL

In another exemplary embodiment of the invention, a narrow fin channel may be defined through the use of lateral epitaxy. In conventional FinFETs, fin width is typically defined by conventional etching processes that are difficult to control. Use of lateral epitaxy for fin formation, in accordance with this exemplary embodiment of the invention, improves control of FinFET fin width.

Figure 7A:
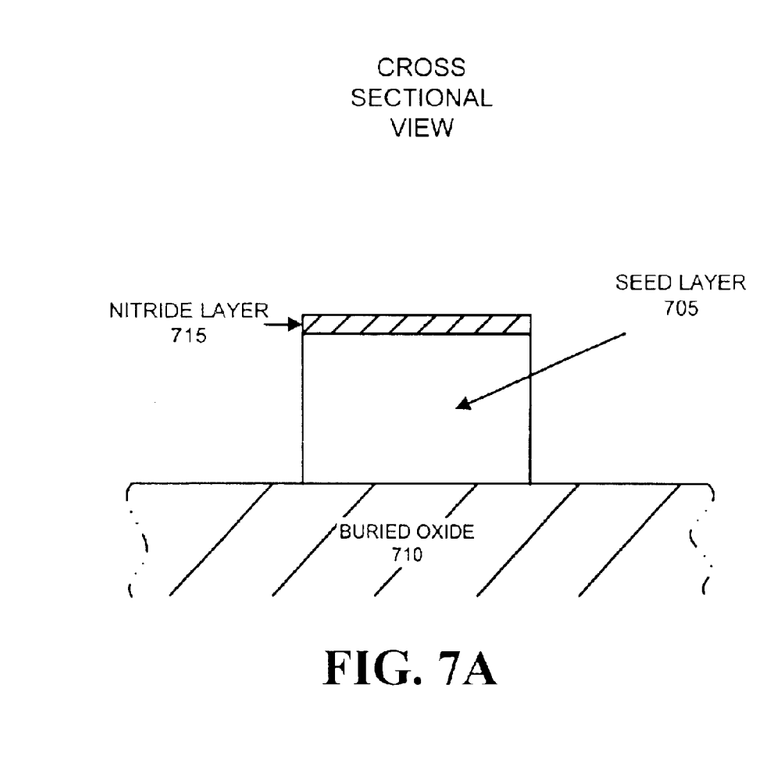
FIGS. 7A and 7B illustrate an exemplary seed layer and nitride layer consistent with another exemplary embodiment of the invention.
Figure 7B:
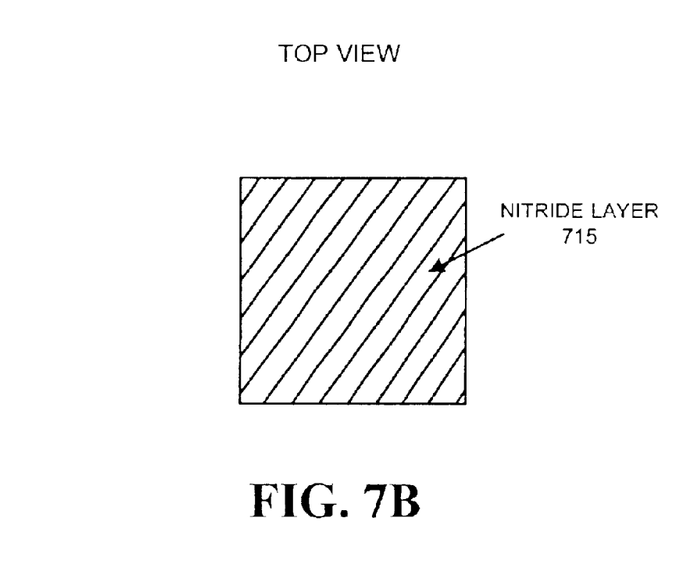

As shown in FIGS. 7A and 7B, definition of a narrow fin channel may begin with the formation of a seed layer 705 on a buried oxide layer 710. Seed layer 705 may include a non-lithographically limited feature that may further include, for example, a rectangular feature defined in a semiconducting material, such as, for example, germanium (Ge) or $Si(x)Ge(1-x)$. A layer 715 of material, such as, for example, nitride may be formed upon seed layer 705. The thickness of layer 715 may range, for example, from about 300 Å to about 800 Å.

Figure 8A:
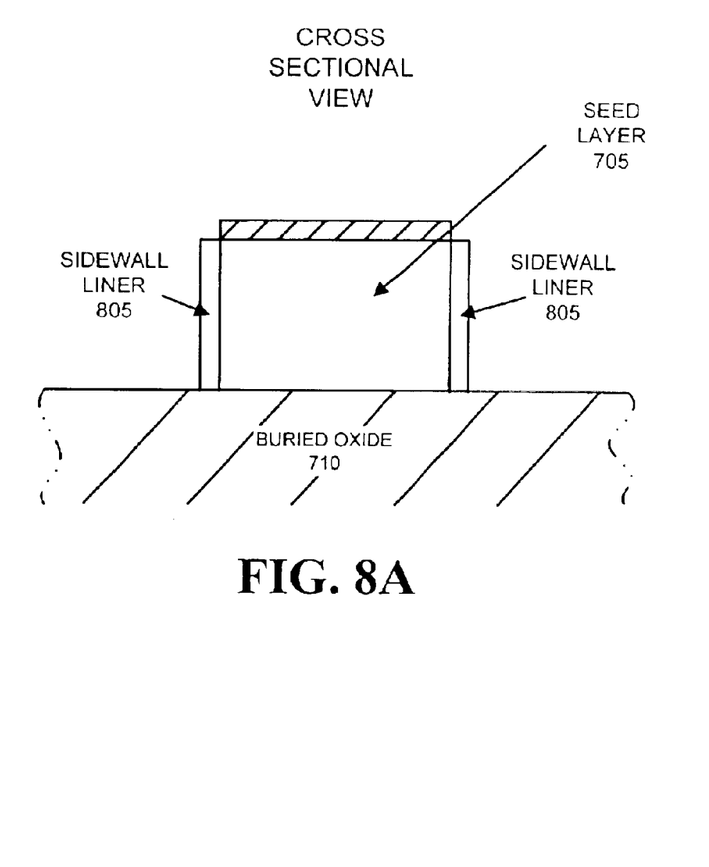
FIGS. 8A and 8B illustrate formation of an exemplary sidewall liner upon the seed layer of FIG. 7A consistent with the invention.
Figure 8B:
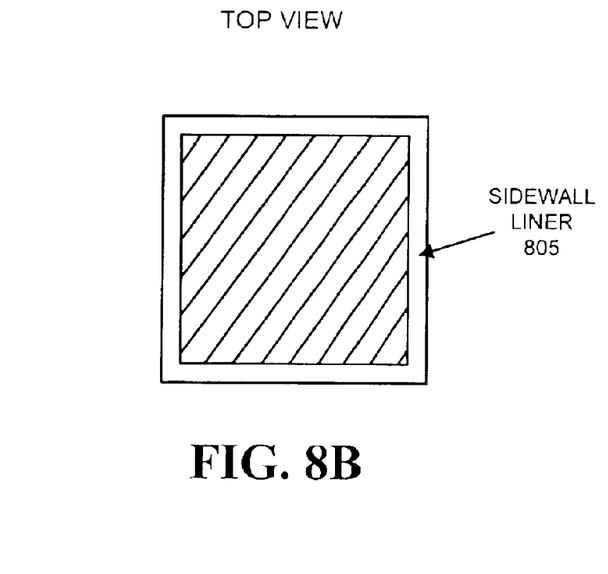

The semiconducting material (e.g., Ge, Si(x)Ge(1-x)) of seed layer 705 may then be used as a seed to epitaxially grow controllable amounts of another semiconducting material, such as, for example, silicon (Si), on sidewalls of feature 705 to produce a sidewall liner 805, as shown in FIGS. 8A and 8B. Selective epitaxial growth with excellent thickness control can, thus, be obtained.

Figure 9A:
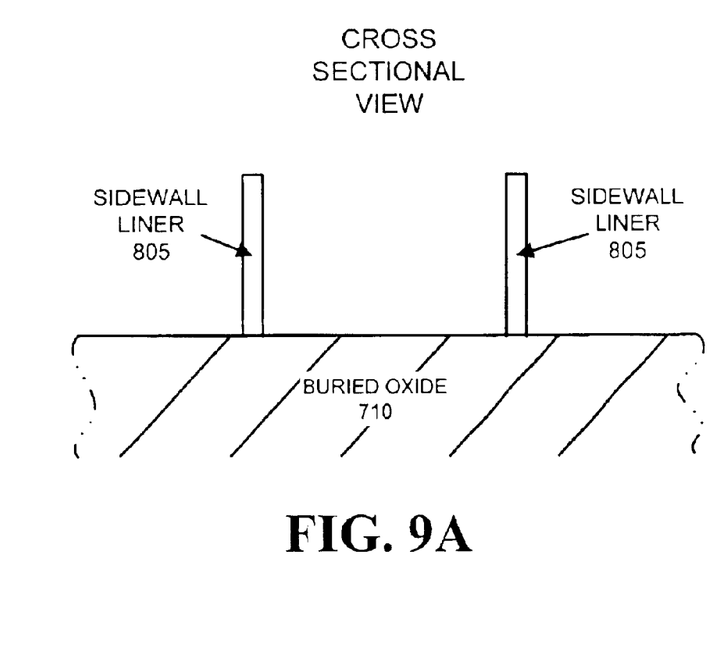
FIGS. 9A and 9B illustrate the removal of the seed layer of FIG. 8A and the etching of different regions of the sidewall liner of FIG. 8B to isolate fins consistent with the invention.
Figure 9B:
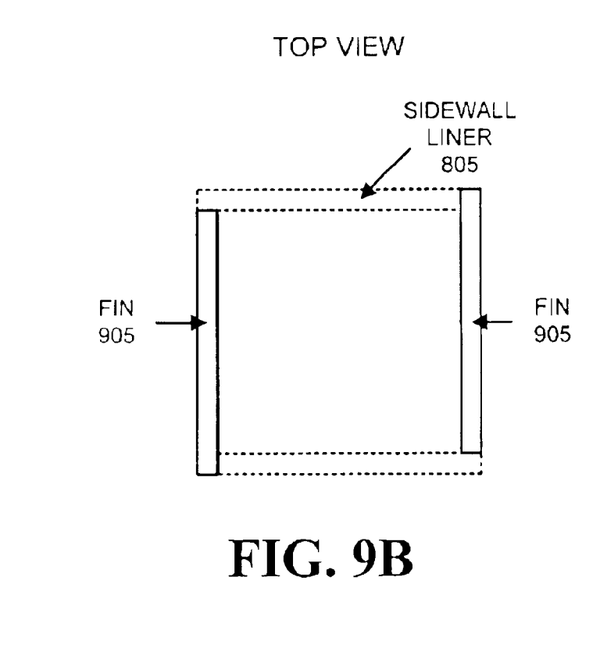

As shown in FIGS. 9A and 9B, nitride layer 715 and seed layer 705 may then be selectively etched to leave the sidewall liner 805 as a very narrow "ring" of free standing semi-conducting material. Different regions of sidewall liner 805 may then be etched to isolate fins 905 for use in a FinFET.

EXEMPLARY REDUCED SERIES RESISTANCE FINFET SOURCE/DRAIN

In yet another exemplary embodiment of the invention, source and drain regions of a FinFET may be etched and regrown for the purpose of reducing series resistance. Conventional FinFETs suffer from parasitic series resistance due to the narrow fin channel not being adjacent to a heavily doped region. Consistent with this exemplary embodiment of the invention, FinFET low series resistance source/drain regions are formed adjacent to the fin channel in a self-aligned manner through etching and regrowth processes.

Figure 10:
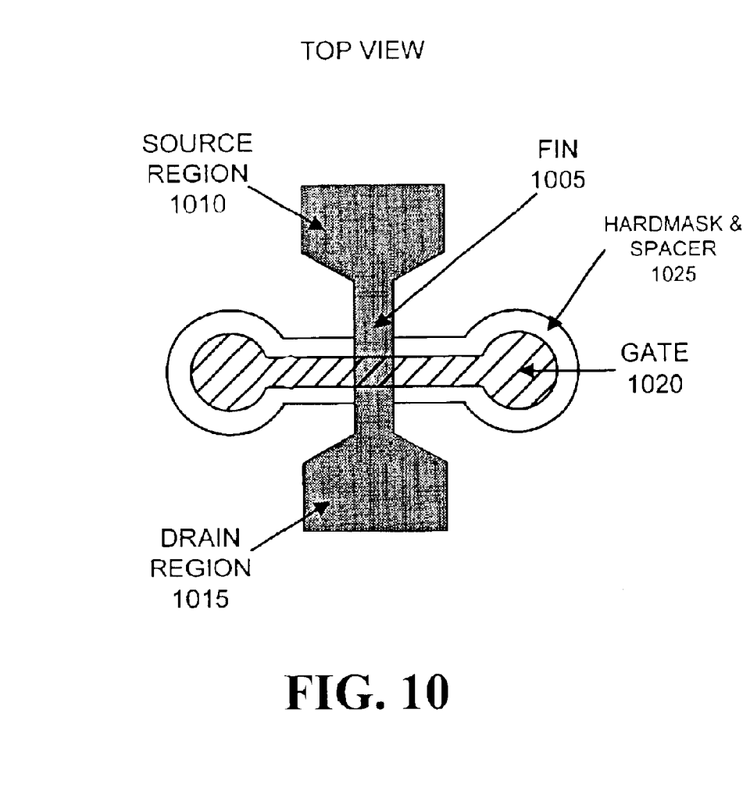
FIG. 10 illustrates a top view of a hard mask and spacer formed on a gate of a FinFET consistent with the invention.

As shown in FIG. 10, a fin 1005, source region 1010, drain region 1015 and gate 1020 are formed using existing processes. Fin 1005, source region 1010 and drain region 1015 may include a semiconducting material, such as, for example, Si. Gate 1020 may include a semi-conducting material, such as, for example, polysilicon. Subsequent to formation of gate 1020 over fin 1005, a hard mask and spacer 1025 may be formed on gate 1020 such that no hard mask or spacer 1005 is formed over fin 1005. Hard mask and spacer 1025 should be formed to enclose gate 1020 completely. The spacer may include, for example, a nitride material, that may be formed using existing deposition processes.

Figure 11:
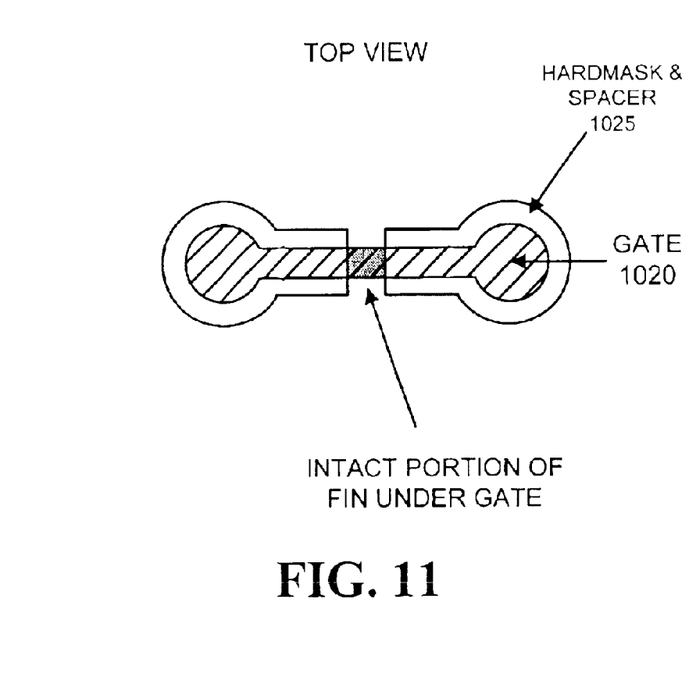
FIG. 11 illustrates exemplary etching of the source and drain regions of FIG. 10 consistent with the invention.
Figure 12:
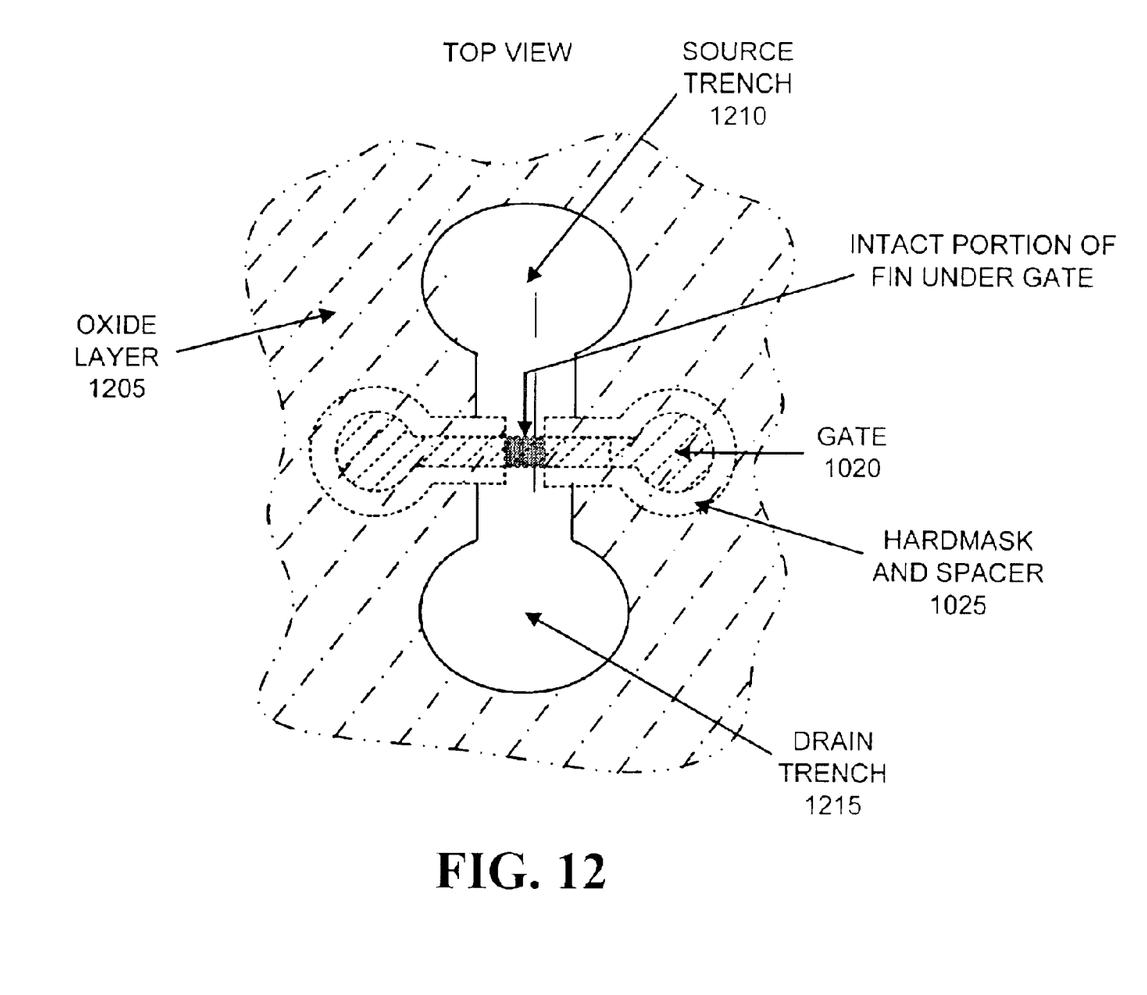
FIG. 12 illustrates exemplary trench formation and epitaxial regrowth of FinFET source and drain regions consistent with the invention.

As shown in FIG. 11, source region 1010 and drain region 1015, and portions of fin 1005 not covered by gate 1020, may then be etched away. Subsequent to the etching, an intact portion of fin 1005 will remain under gate 1020. The intact portion of fin 1005 under gate 1020 may then be used as a seed for re-growing the FinFET source and drain, as shown in FIG. 12. Before, re-growing the source and drain, an oxide layer 1205 may be formed using, for example, existing deposition techniques. Oxide layer 1205 may include, for example, silicon oxide, and have a thickness ranging from about 1500 Å to about 2500 Å. A source trench 1210 and a drain trench 1215 may then be opened in oxide layer 1205 using existing etching processes. The trench openings that includes source trench 1210 and drain trench 1215 may be misaligned with respect to the opening in the channel (i.e., the intact portion of the fin under gate 1020) because the trench openings are wide enough such that as long as the etched region of the channel under gate 1020 is exposed in the trench, the source/drain regrowth will be aligned to it. This is advantageous since overlay tolerances may not permit exact alignment. The use of the hardmask and spacer 1025 allows for this margin since the entire channel is not exposed.

A source and drain region may then be epitaxially regrown in source trench 1210 and drain trench 1215, respectively. n+ Si may be regrown to fill source trench 1210 and drain trench 1215 to form NMOS transistors, or p+ Si may be regrown to fill source trench 1210 and drain trench 1215 to form PMOS transistors. To form CMOS circuits, the oxide etch, regrowth and planarization will have to be done twice, once for the NMOS transistors and once for the PMOS. A vertical junction may, thus, be formed between the regrown source and drain regions and the intact portion of fin 1005 under gate 1020. The hardmask and spacer 1025 formed over gate 1020 further prevent the epitaxially regrown source and drain regions from shorting. Subsequent to regrowth, the source and drain regions in trenches 1210 and 1215 may be planarized.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic and etching techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a gate electrode for a fin field effect transistor (FinFET), comprising:
   forming a fin on a substrate;
   forming an oxide layer over the fin;
   forming a carbon layer over the oxide layer;
   forming a trench in the oxide layer and the carbon layer, the trench crossing over the fin; and
   filling the trench with a material to form the gate electrode.

2. The method of claim 1, further comprising:
   applying a layer of anti-reflective coating (ARC) to the carbon layer.

3. The method of claim 2, further comprising:
   depositing and patterning a layer of photo-resist material on the anti-reflective coating.

4. The method of claim 1, further comprising:
   applying a nitride layer to the fin before forming the oxide layer over the fin.

5. The method of claim 3, further comprising:
   etching away at least a portion of the carbon layer to leave carbon formed as a protrusion in the pattern of the photo-resist material.

6. The method of claim 5, further comprising:
   forming a nitride layer on the oxide layer.

7. The method of claim 6, further comprising:
   removing the carbon formed as a protrusion in the pattern of the photo-resist material to expose a portion of the oxide layer; and
   etching the exposed portion of the oxide layer to form the trench.

8. The method of claim 7, further comprising:
   removing the nitride layer.

9. The method of claim 8, further comprising:
   forming a dielectric layer over the fin within the trench.

10. The method of claim 9, wherein filling the trench with the material further comprises:

depositing at least one of a polysilicon and a metal material within the trench to form the gate electrode.

11. The method of claim 10, further comprising:

polishing the at least one of the polysilicon and the metal material of the gate electrode.

12. A method of forming a gate electrode for a fin field effect transistor (FinFET), comprising:

forming an oxide layer over a fin;

forming a carbon layer over the oxide layer;

forming a layer of photo-resist material in a pattern corresponding to a shape of the gate electrode;

etching, using the layer of photo-resist material, the carbon layer to produce a portion of the carbon layer formed in the pattern of the photo-resist material;

forming a nitride layer adjacent to the portion of the carbon layer;

removing the portion of the carbon layer to expose a portion of the oxide layer;

etching the exposed portion of the oxide layer to form a trench in the oxide layer; and filling the trench with a material to form the gate electrode.

13. The method of claim 12, wherein the material comprises polysilicon/metal.

14. The method of claim 12, further comprising:

applying a layer of anti-reflective coating to the carbon layer prior to applying the photo-resist material.

15. The method of claim 12, further comprising:

forming a dielectric layer over the fin within the trench prior to filling the trench with the material to form the gate electrode.

16. The method of claim 12, further comprising:

forming a nitride layer over a top portion of the fin prior to forming the oxide layer.

17. The method of claim 12, further comprising:

polishing the material after the filling.

* * * * *